United States Patent
Oka et al.

(10) Patent No.: US 7,218,335 B2
(45) Date of Patent: May 15, 2007

(54) IMAGE RECORDING APPARATUS AND IMAGE RECORDING METHOD

(75) Inventors: Junichi Oka, Kyoto (JP); Yasuo Kurusu, Kyoto (JP); Mamoru Fujimoto, Kyoto (JP); Osamu Morizono, Kyoto (JP)

(73) Assignee: Dainippon Screen Mfg. Co., Ltd., Kyoto (JP)

( * ) Notice: Subject to any disclaimer, the term of this patent is extended or adjusted under 35 U.S.C. 154(b) by 394 days.

(21) Appl. No.: 10/852,107

(22) Filed: May 25, 2004

(65) Prior Publication Data

US 2004/0240922 A1    Dec. 2, 2004

(30) Foreign Application Priority Data

May 28, 2003    (JP)    ............................. 2003-150880

(51) Int. Cl.
*B41J 2/45* (2006.01)
*B41J 2/435* (2006.01)
*B41J 2/455* (2006.01)

(52) U.S. Cl. ...................... 347/238; 347/232; 347/233

(58) Field of Classification Search ........ 347/115–118, 347/130–132, 232–235, 237–238, 248–254, 347/240; 358/1.1, 1.9, 3.01, 3.02
See application file for complete search history.

(56) References Cited

U.S. PATENT DOCUMENTS

| | | |
|---|---|---|
| 5,182,990 A | 2/1993 | Kline et al. |
| 6,075,614 A * | 6/2000 | Ohtsuka et al. .............. 358/1.1 |
| 6,249,306 B1 | 6/2001 | Isono et al. |
| 6,690,404 B2 * | 2/2004 | Shimada et al. ............ 347/115 |
| 6,864,908 B2 * | 3/2005 | Corona et al. .............. 347/238 |

* cited by examiner

*Primary Examiner*—Hai Pham
(74) *Attorney, Agent, or Firm*—McDermott Will & Emery LLP

(57) ABSTRACT

The inventive image recording apparatus records unit images with different combinations of light beams among a plurality of light beams emissive from a recording head when preparing the respective ones of C, M, Y and K plates. Also when the plurality of light beams are dispersed in quantity of light, therefore, density distributions of different tendencies result in the unit images recorded on the respective ones of the C, M, Y and K plates. In a resultant image formed by superposing the unit images with each other, therefore, fluctuation of densities can be canceled and reduced.

17 Claims, 13 Drawing Sheets

| RECORDING MODE INFORMATION | USED LIGHT BEAM | d1 | d2 | ... | d8 | d9 | ... | d16 | d17 | ... | d24 | d25 | ... |
|---|---|---|---|---|---|---|---|---|---|---|---|---|---|
| FIRST RECORDING MODE | B1~B16 | B1 | B2 | ... | B8 | B9 | ... | B16 | B1 | ... | B8 | B9 | ... |
| SECOND RECORDING MODE | B1~B8 | B1 | B2 | ... | B8 | B1 | ... | B8 | B1 | ... | B8 | B1 | ... |
| | B4~B11 | B4 | B5 | ... | B11 | B4 | ... | B11 | B4 | ... | B11 | B4 | ... |
| | B6~B13 | B6 | B7 | ... | B13 | B6 | ... | B13 | B6 | ... | B13 | B6 | ... |
| | B9~B16 | B9 | B10 | ... | B16 | B9 | ... | B16 | B9 | ... | B16 | B9 | ... |

FIG. 5

| | B1 | B2 | B3 | B4 | B5 | B6 | B7 | B8 | B9 | B10 | B11 | B12 | B13 | B14 | B15 | B16 | REFERENCE NUMBER |
|---|---|---|---|---|---|---|---|---|---|---|---|---|---|---|---|---|---|
| C PLATE | ○ | ○ | ○ | ○ | ○ | ○ | ○ | ○ | × | × | × | × | × | × | × | × | C1 |
| M PLATE | × | × | × | ○ | ○ | ○ | ○ | ○ | ○ | ○ | ○ | × | × | × | × | × | C2 |
| Y PLATE | × | × | × | × | × | ○ | ○ | ○ | ○ | ○ | ○ | ○ | ○ | × | × | × | C3 |
| K PLATE | × | × | × | × | × | × | × | × | ○ | ○ | ○ | ○ | ○ | ○ | ○ | ○ | C4 |

○ : USED   × : UNUSED

FIG. 6

| RECORDING MODE INFORMATION | USED LIGHT BEAM | d1 | d2 | ... | d8 | d9 | ... | d16 | d17 | ... | d24 | d25 |
|---|---|---|---|---|---|---|---|---|---|---|---|---|
| FIRST RECORDING MODE | B1~B16 | B1 | B2 | ... | B8 | B9 | ... | B16 | B1 | ... | B8 | B9 |
| SECOND RECORDING MODE | B1~B8 | B1 | B2 | ... | B8 | B1 | ... | B8 | B1 | ... | B8 | B1 |
| | B4~B11 | B4 | B5 | ... | B11 | B4 | ... | B11 | B4 | ... | B11 | B4 |
| | B6~B13 | B6 | B7 | ... | B13 | B6 | ... | B13 | B6 | ... | B13 | B6 |
| | B9~B16 | B9 | B10 | ... | B16 | B9 | ... | B16 | B9 | ... | B16 | B9 |

SUBSCANNING POSITION

SUBSCANNING POSITION

F I G . 1 1
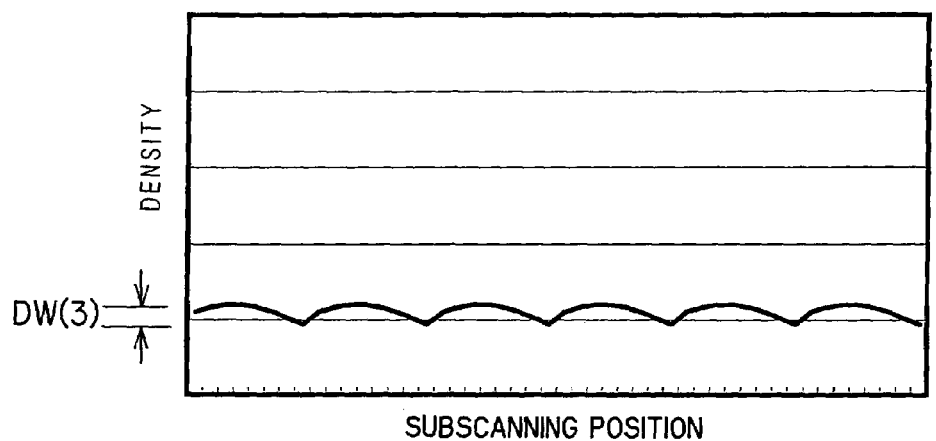
F I G . 1 2
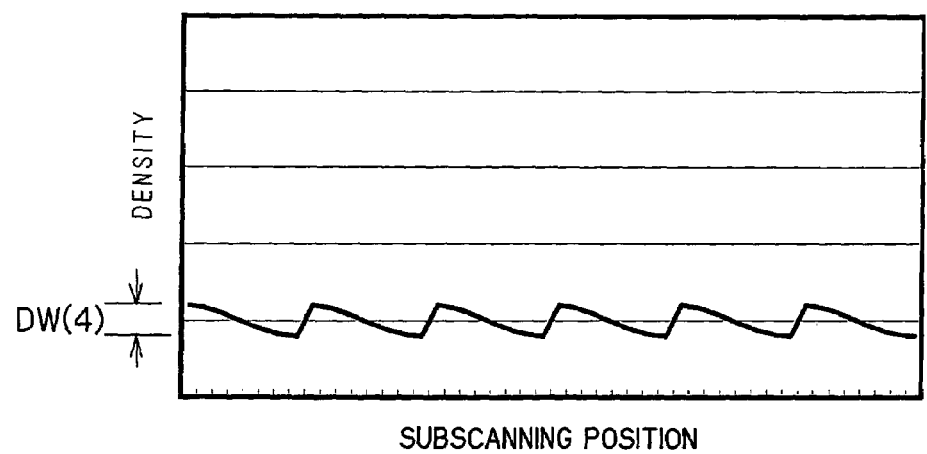

F I G . 1 3
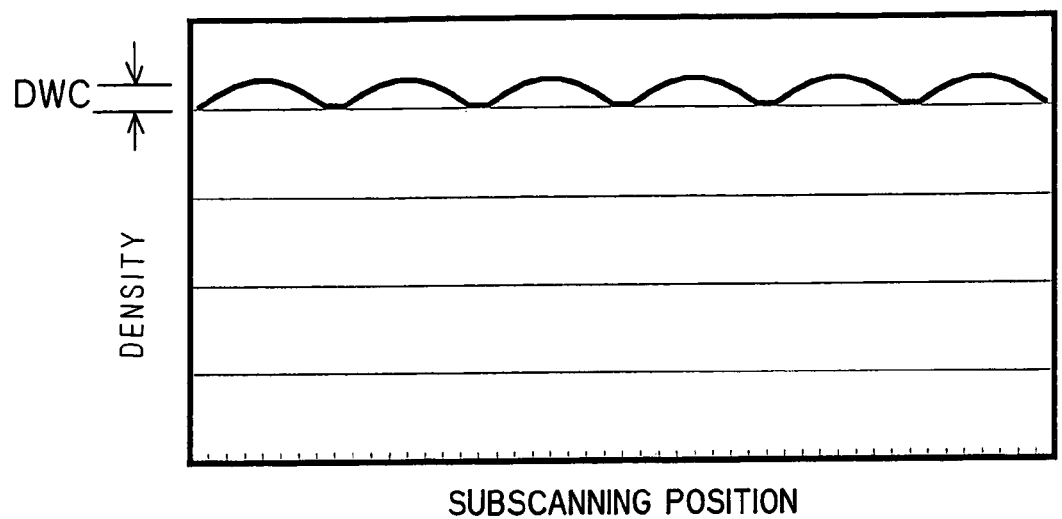

IMAGE RECORDING APPARATUS AND IMAGE RECORDING METHOD

BACKGROUND OF THE INVENTION

1. Field of the Invention

The present invention relates to an image recording apparatus and an image recording method recording the respective ones of a plurality of unit images superposed with each other for forming a resultant image with a recording head comprising a plurality of recording sources.

2. Description of the Background Art

In a printing step, a resultant image may be formed by superposing a plurality of unit images such as a plurality of color-component images, for example, with each other. An image recording apparatus preparing printing plates corresponding to the respective ones of the plurality of unit images is employed in this printing step.

FIG. 15 shows an exemplary conventional image recording apparatus 100. In the image recording apparatus 100 shown in FIG. 15, a recording material 120 is mounted on the outer peripheral surface of a cylindrical recording drum 110, which is rotated in a main scanning direction (direction Y in FIG. 15) for scanning the recording material 120 with a recording head 130 in a subscanning direction (direction Y in FIG. 15) along an axis 111 of rotation of the recording drum 110. Thus, the image recording apparatus 100 two-dimensionally records unit images on a recording surface of the recording material 120 and prepares printing plates. In order to improve the recording speed, the image recording apparatus 100 employs the recording head 130 of a multichannel system capable of emitting a plurality of light beams B1, B2, . . . toward the recording material 120. The image recording apparatus 100 feeds the recording head 130 by a distance corresponding to the recording width of the plurality of light beams B1, B2, . . . in the subscanning direction during single rotation of the recording drum 110. Therefore, unit images are uninterruptedly recorded on the recording material 120.

If the plurality of light beams B1, B2, . . . are dispersed in quantity of light in this image recording apparatus 100, however, periodic fluctuation (nonuniformity) of densities results in the unit images recorded on the recording material 120.

It is assumed that the quantities of light of the plurality of light beams B1, B2, . . . are sinusoidally distributed as shown in FIG. 7, for example. In this case, the densities of the unit images recorded on the recording material 120 periodically fluctuate as shown in FIG. 8A. A period of this density fluctuation is equal to the recording width of the plurality of light beams B1, B2, . . . . FIG. 8A shows the density distribution of the unit images with reference to only one dimension in the subscanning direction.

When a resultant image is formed by superposing the plurality of unit images (images of printing plates of black, cyan, magenta, yellow, a special color etc., for example) recorded in the aforementioned manner with each other, periodic density fluctuation of the unit images is amplified by the superposition. Therefore, larger density fluctuation appears in the resultant image, as shown in FIG. 8B. Also when the quantities of light of the plurality of light beams B1, B1, B2, . . . are only slightly dispersed, it follows that large density fluctuation appears in the resultant image obtained by superposing the unit images recorded with the light beams B1, B1, B2, . . . with each other.

On the other hand, it is impossible in practice to completely uniformize the quantities of light of the plurality of light beams B1, B1, B2, . . . in the multichannel recording head 130. Therefore, the image recording apparatus 100 requires a technique capable of reducing the density fluctuation in the resultant image obtained by superposing the unit images recorded with the plurality of light beams B1, B1, B2, . . . dispersed in quantity of light.

The cause for the density fluctuation is not only the aforementioned dispersion between the quantities of light of the plurality light beams B1, B1, B2, . . . . Fluctuation of the profiles of the individual light beams B1, B1, B2, . . . or dispersion of optical pulse widths modulated on the basis of recorded image signals may also cause density fluctuation.

This problem may be caused not only in an image recording apparatus preparing printing plates but also in an image recording apparatus recording the respective ones of a plurality of unit images superposed with each other for forming a resultant image with the same recording head. This problem may further be caused not only in an image recording apparatus recording unit images with light beams but also in an image recording apparatus recording unit images with a recording head comprising a plurality of independent recording sources.

SUMMARY OF THE INVENTION

The present invention is directed to an image recording apparatus for separately recording respective unit images which are to be superposed to form an objective image.

According to the present invention, the image recording apparatus comprises a) a recording head comprising a plurality of recording sources which are independently controllable and b) a controller for controlling the plurality of recording sources in a partial-source recording mode in which different sub-sets of recording sources, which are at least partially different from each other, are employed to record at least two unit images of the objective image, respectively.

The image recording apparatus can cause density distributions of different tendencies in at least two of the plurality of unit images, for canceling and reducing periodic density fluctuation appearing in the objective image formed by superposing these unit images with each other.

Preferably, all of the sub-sets of recording sources comprise same numbers of adjacent recording sources.

It follows that the image recording apparatus necessarily employs different recording sources for recording the same positions between the plurality of unit images. Therefore, the image recording apparatus can more reliably reduce the periodic density fluctuation in the objective image. Further, the image recording apparatus can shorten the density fluctuation period in the objective image, so that the density fluctuation is inconspicuous.

More preferably, the controller enables the recording head such that 1) a unit image is recorded on a recording medium by a selected sub-set of recording sources, and 2) information indicating the selected sub-set of recording sources is recorded on a marginal region of the recording medium.

When one of the plurality of unit images superposed with each other for forming the objective image must be re-recorded, for example, it is possible to recognize the sub-set of the recording sources employed for the precedent recording.

More preferably, the controller is operable in a selected one of i) the partial-source recording mode, and ii) a full-source recording mode in which all of the plurality of recording source are used to record respective ones of the respective unit images.

The image recording apparatus can select and use a proper recording mode in response to the attributes of unit images, i.e., required quality of the unit images.

More preferably, the controller comprises a receiving element receiving appendix data indicating respective attributes of the at least two unit images, and a selecting element selecting one of the partial-source recording mode and the full-source recording mode in response to the appendix data.

The image recording apparatus automatically selects a proper recording mode, whereby the work burden on an operator is reduced.

More preferably, the controller further comprises a selection element selecting the sub-sets of recording sources in response to the appendix data.

The image recording apparatus automatically selects proper sub-sets of the recording sources, whereby the work burden on the operator is reduced.

More preferably, the objective image is a multi-color image, the respective unit images are color-component images of the multi-color image, and the plurality of recording sources are light sources selectively emitting light beams onto a photosensitive medium to obtain respective ones of printing plates prepared for a printing process of the multi-color image.

When the image recording apparatus superposes color-component images prepared on the respective printing plates with each other for preparing a multi-color image as the objective image, periodic density fluctuation caused in this objective image is reduced, whereby a high-quality multi-color image can be prepared.

The present invention is also directed to a method of recording respective unit images which are to be superposed to form an objective image using a recording head comprising a plurality of recording sources which are independently controllable.

Accordingly, an object of the present invention is to reduce periodic density fluctuation in a objective image in an image recording technique recording the respective ones of a plurality of unit images superposed with each other for forming an objective image with the same recording head comprising a plurality of independent recording sources.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 illustrates exemplary correspondence between color information of recorded unit images and combinations of light beams used for the respective unit images;

FIG. 6 illustrates exemplary results of allocation of light beams for recording respective line data;

FIGS. 9 to 12 illustrate exemplary density distributions of unit images recorded in a second recording mode respectively;

FIG. 13 illustrates an exemplary density distribution of a resultant image formed by superposing a plurality of unit images recorded in the second recording mode with each other;

DESCRIPTION OF THE PREFERRED EMBODIMENTS

Figure 1:
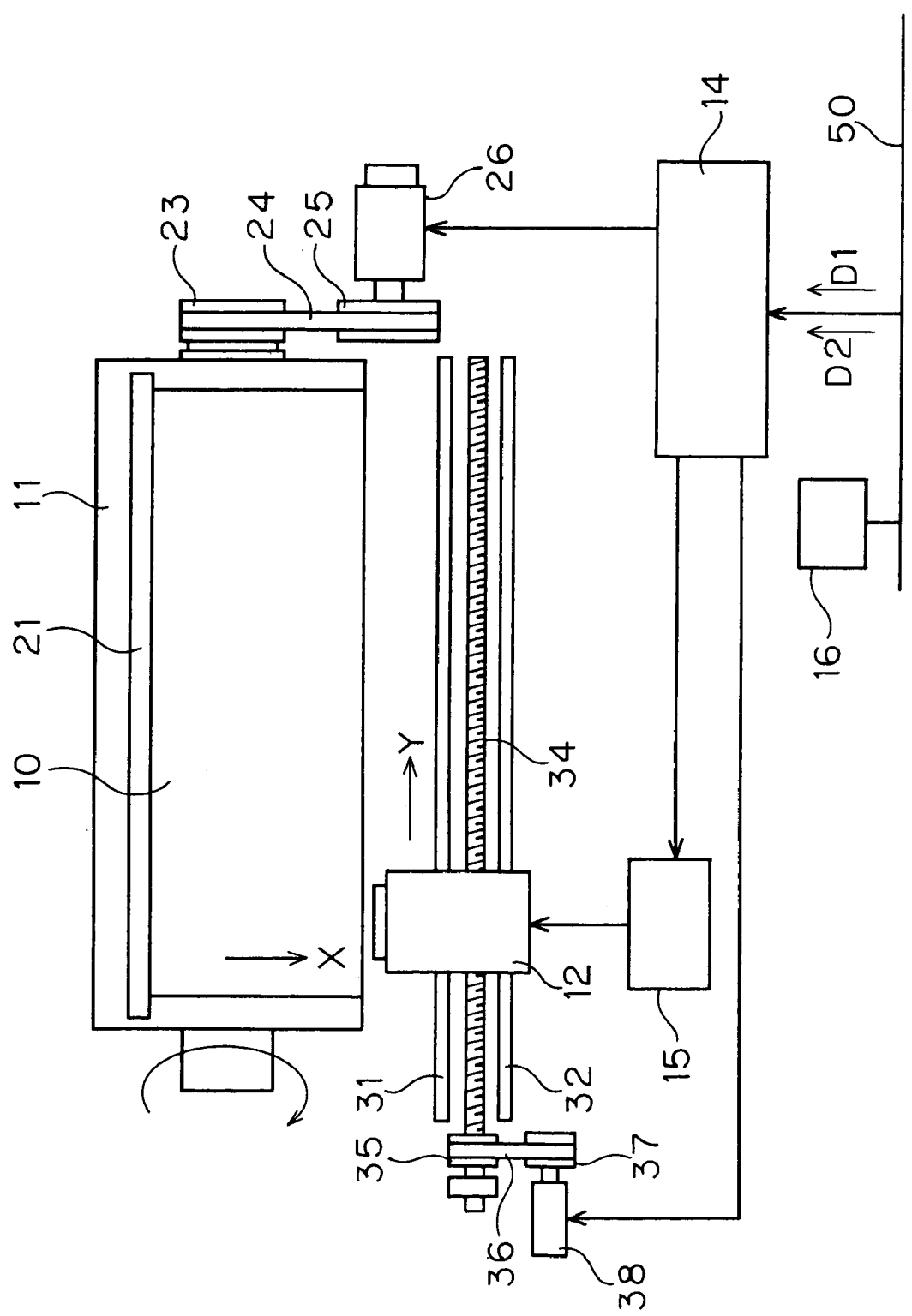
FIG. 1 is a schematic plan view of an image recording apparatus according to an embodiment of the present invention.
Figure 2:
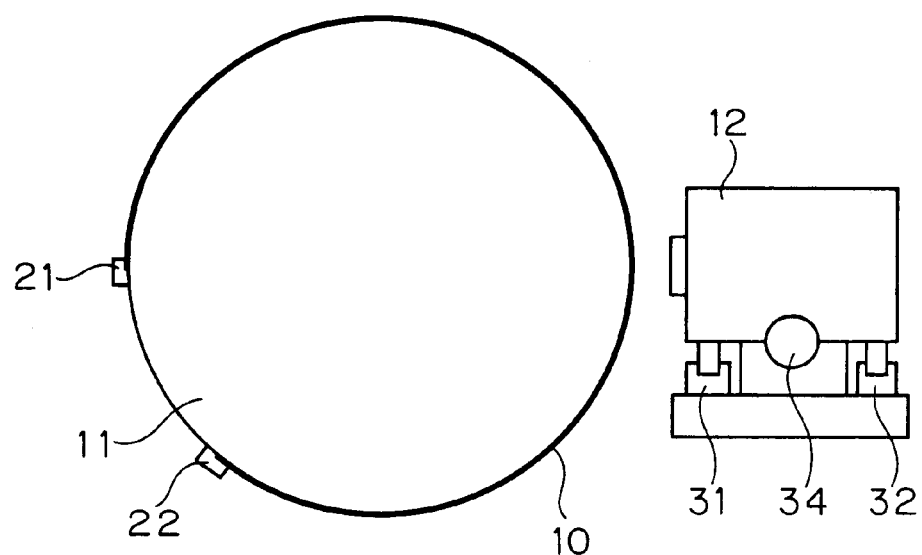
FIG. 2 is a schematic side elevational view of the image recording apparatus according to the embodiment of the present invention.

An embodiment of the present invention is now described with reference to the drawings. FIG. 1 is a schematic plan view of an image recording apparatus 1 according to the embodiment of the present invention. FIG. 2 is a schematic side elevational view of the image recording apparatus 1 according to this embodiment.

<1. Structure of Principal Part of Image Recording Apparatus 1>

The image recording apparatus 1 separately records a plurality of unit images on a recording material or a photosensitive material 10, in order to prepare printing plates corresponding to the respective ones of the unit images forming a resulting multi-color image. The image recording apparatus 1 mainly comprises a cylindrical recording drum 11 rotating with the recording material 10 mounted thereon, a recording head 12 emitting light beams toward the recording material 10 and a control part 14 controlling operations of the overall image recording apparatus 1.

The recording drum 11 is capable of axially rotating with the recording material 10 mounted on the outer peripheral surface thereof. A pair of clamp members 21 and 22 are arranged on the outer peripheral surface of the recording drum 11, in order to clamp ends of the recording material 10 for mounting the recording material 10 on the recording drum 11. An end of the recording drum 11 is coupled with a main scanning motor 26 through a timing pulley 23, a timing belt 24 and another timing pulley 25. When driving the main scanning motor 26, therefore, it is possible to transmit its driving force to the recording drum 11 and axially rotating the same. The recording material 10 also axially rotates with the recording drum 11. In the image recording apparatus 1, the direction (direction X in FIG. 1) of rotation of the recording material 10 defines the main scanning direction.

Figure 3:
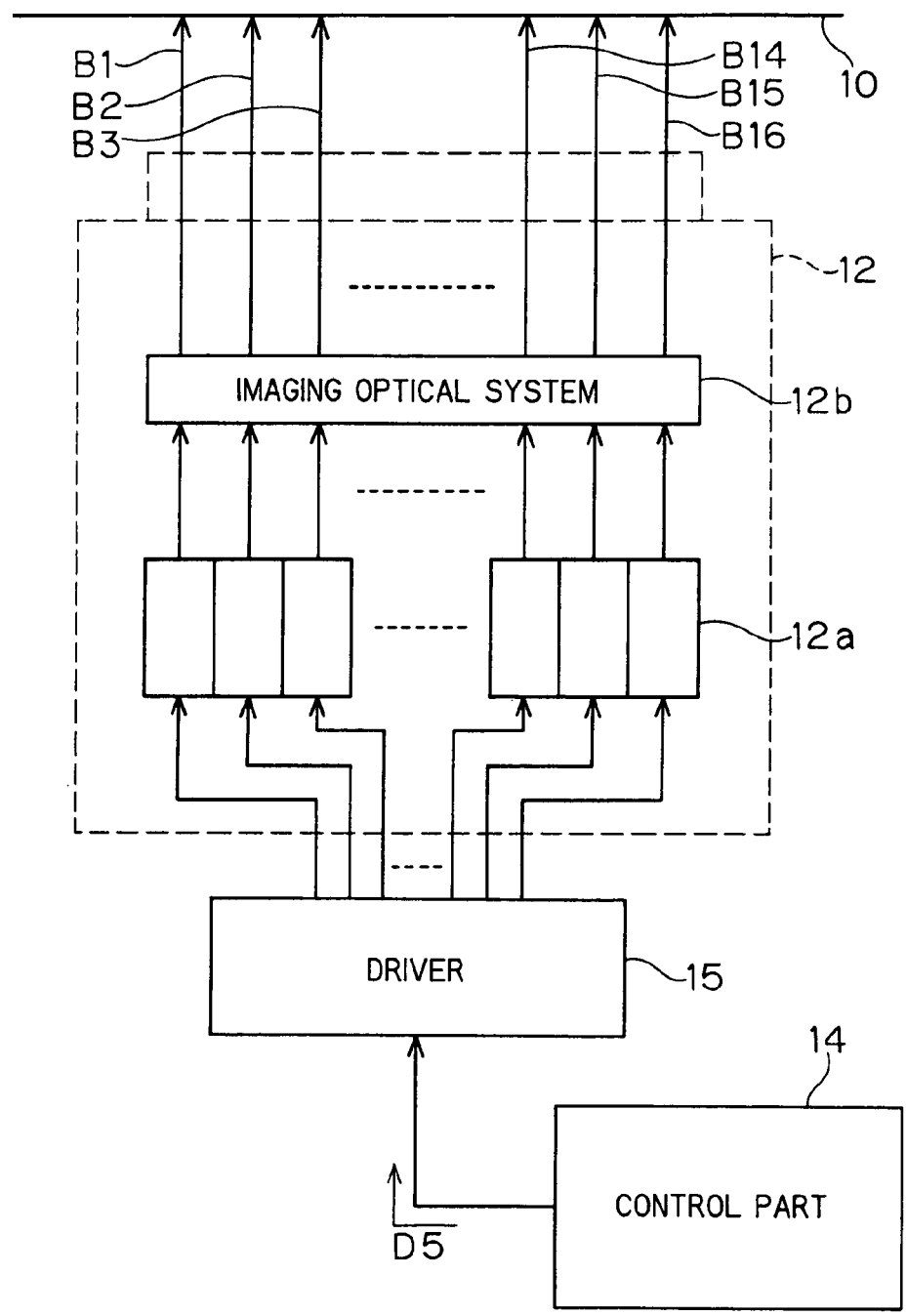
FIG. 3 schematically illustrates a principal part of a recording head.

FIG. 3 schematically illustrates a principal part of the recording head 12. The recording head 12 is a multichannel recording head capable of emitting 16 light beams B1 to B16. This recording head 12 mainly comprises 16 integrally arranged light sources 12a and an imaging optical system 12b. The 16 light sources 12a, formed by semiconductor lasers or LEDs or the like, correspond to the "recording sources" in the present invention. The 16 light sources 12a can emit the light beams B1 to B16 and stop emitting the light beams B1 to B16 independently of each other by receiving a driving signal D5 from the control part 14 through a driver 15. In order to use one of the light beams B1 to B16, therefore, the recording head 12 uses the light source 12a corresponding to this light beam. The light beams B1 to B16 emitted from the 16 light sources 12a form an image on a recording surface of the recording material 10 through the imaging optical system 12b. As shown in FIGS. 1 and 2, the recording head 12 fits with a ball screw 34 extending in a subscanning direction (direction Y in FIG. 1) parallel to the axis of the recording drum 11. The ball screw 34 is coupled with a subscanning motor 38 through a timing pulley 35, a timing belt 36 and another timing pulley 37. When driving the subscanning motor 38, therefore, it is possible to transmit its driving force to the ball screw 34 for rotating the same thereby making the recording head 12 scan the recording material 10 in the subscanning direction. The image recording apparatus 1 guides this scanning of the recording head 12 along a pair of rails 31 and 32 arranged in parallel with the ball screw 34.

Due to the aforementioned structure, the image recording apparatus 1 can two-dimensionally scan the recording surface of the recording material 10 while emitting the plurality of light beams B1 to B16 from the recording head 12 for recording a unit image on the recording surface. The image recording apparatus 1 feeds the recording head 12 by a distance corresponding the recording width of the plurality of emitted light beams in the subscanning direction during single rotation of the recording drum 11. Therefore, a unit images is uninterruptedly recorded on the recording surface of the recording material 10.

The control part 14 is a computer system controlling the operations of the overall image recording apparatus 1 according to a prescribed program. This control part 14 is electrically connected with the respective parts of the image recording apparatus 1, and connected to a network 50. This network 50 corresponds to a local network such as a LAN (local area network) or a wide-area network such as the Internet. The control part 14 can receive image data D1 and appendix data D2 from the network 50. The image data D1 is formed by raster data expressing the respective ones of the plurality of unit images forming a resultant image. The appendix data D2 is formed by various information indicating the attributes of the unit images. More specifically, the appendix data D2 includes color information indicating the colors of the unit images, halftone dot information indicating the systems and angles of arrangement of halftone dots constituting the unit images, line density information indicating the recording line density of the unit images, information indicating the type of the recording material 10, plate number information indicating the number of the unit images finally constituting the resulting image etc. The network 50 is connected with input means 16. An operator can input various information from the input means 16 for transmitting the same to the control part 14.

Figure 4:
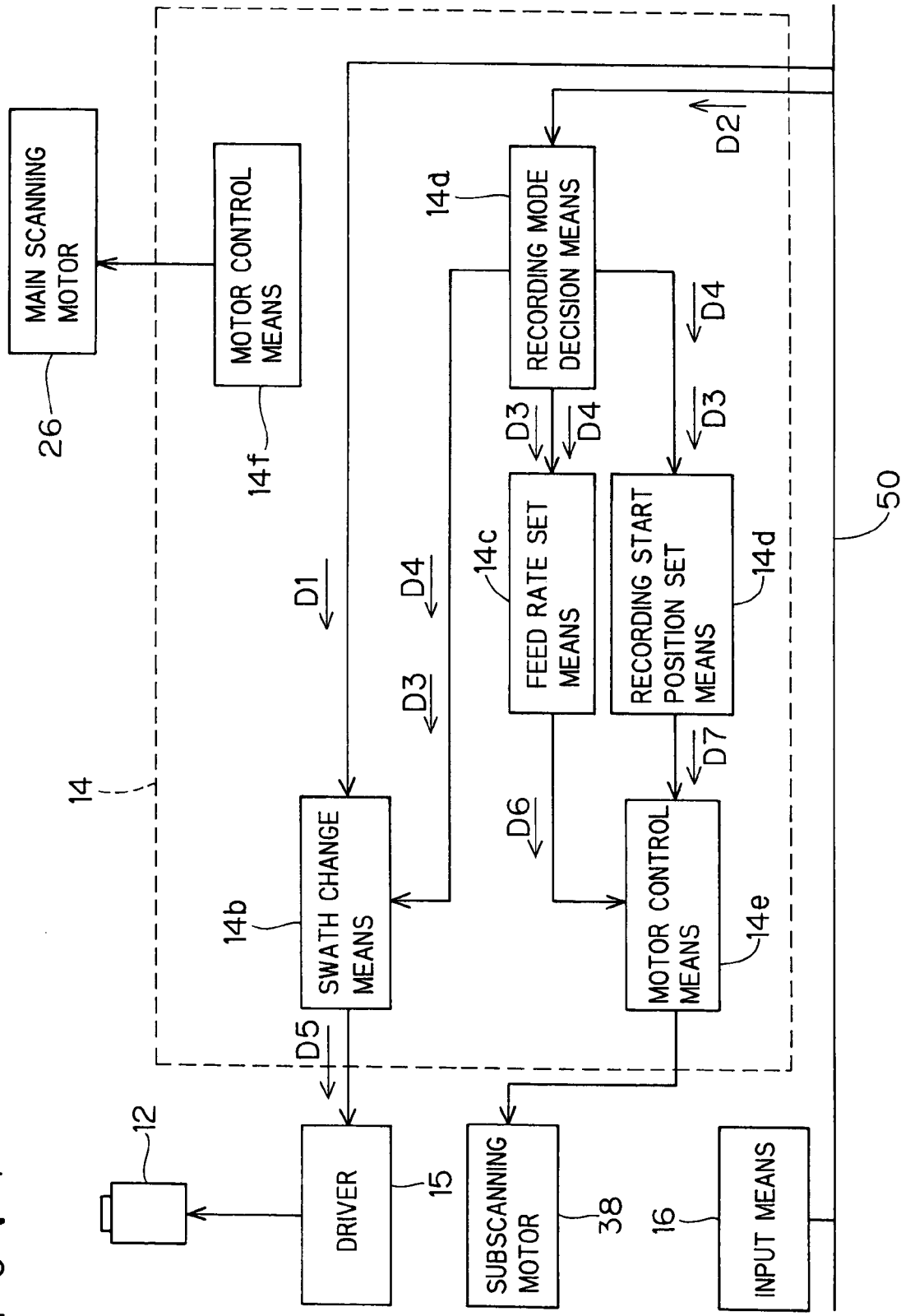
FIG. 4 is a block diagram showing principal electric structures in the inner and outer sides of a control part.

FIG. 4 is a block diagram showing principal electric structures in the inner and outer parts of the control part 14. As shown in FIG. 4, the control part 14 mainly comprises recording mode decision means 14a, swath change means 14b, feed speed set means 14c, recording start position set means 14d and motor control means 14e and 14f.

The recording mode decision means 14a decides a recording mode in the image recording apparatus 1 on the basis of the appendix data D2 received from the network 50. The image recording apparatus 1 is provided with a first recording mode (a full-source recording mode) for recording unit images with all light beams B1 to B16 emitted from the recording head 12 and a second recording mode (a partial-source recording mode) for recording unit images with combinations of specific ones of the 16 light beams B1 to B16. When employing the second recording mode, periodic density fluctuation in the finally formed resultant image is more reduced as compared with the case of employing the first recording mode according to the present invention, as hereinafter described. When employing the second recording mode, however, the image recording apparatus 1 records unit images without using all light beams B1 to B16 and hence the recording speed is reduced as compared with the case of employing the first recording mode. Therefore, it is desirable to select the proper recording mode in response to the attributes of the recorded unit images, i.e., the required quality of the unit images. The image recording apparatus 1 refers to the appendix data D2 in the recording mode decision means 14a for automatically selecting and deciding the employed recording mode.

More specifically, the image recording apparatus 1 selects the recording mode in the following manner: For example, the image recording apparatus 1 refers to the line density information in the appendix data D2 for selecting the first recording mode if the recording line density of the unit images is low while selecting the second recording mode if the same is high. Alternatively, the image recording apparatus 1 refers to the halftone dot information in the appendix data D2, for example, for selecting the first recording mode when the system of halftone dots constituting the unit images is an AM halftone dot system (system of expressing density gradation of the images with the sizes of halftone dots) while selecting the second recording mode when the system is an FM halftone dot (system of expressing density gradation of the images with the density of halftone dots). Further alternatively, the image recording apparatus 1 refers to the plate number information in the appendix data D2, for example, for selecting the first recording mode when the number of the unit images superposed with each other for forming the resultant image, i.e., the number of prepared printing plates is smaller than a prescribed number, while selecting the second recording mode when the former is larger than the latter.

When selecting the second recording mode, the recording mode decision means 14a automatically selects and decides combinations of used light beams from among the 16 light beams B1 to B16. The recording mode decision means 14a selects the combinations of the used light beams with reference to the color information, the halftone dot information etc. in the appendix data D2. For example, the recording mode decision means 14a previously stores correspondence between recorded unit images and combinations of the light beams B1 to B16 used therefor as shown in FIG. 5. The recording mode decision means 14a selects the combinations of the used light beams while collating the color information in the received appendix data D2 with this correspondence. The correspondence shown in FIG. 5 is used for an exemplary case of forming the resultant image with four unit images including a cyan color image (C plate), a magenta color image (M plate), a yellow color image (Y plate) and a black color image (B plate). Referring to FIG. 5, it follows that the recording mode decision means 14a selects eight light beams B1 to B8 or eight light beams B4 to B11 when the color information in the appendix data D2 indicates the C plate or the M plate, while selecting eight light beams B6 to B13 or B9 to B16 when the color information indicates the Y plate or the K plate. Referring to FIG. 5, further, the recording image decision means 14a imparts reference numbers C1, C2, C3 and C4 to the combinations of the eight light beams b1 to B8, the eight light beams B4 to B11, the eight light beams B6 to B13 and the eight light beams B9 to B16 respectively. The image recording apparatus 1 can refer to these reference numbers C1 to C4 in another processing stage. In other words, respective sub-sets of light beams each consisting of eight light beams are selected depending on the color components Y, M, C and K among the sixteen light beams B1 to B16. Preferably, respective sub-sets are obtained by serially shifting a reference sub-set of light beams in the arrangement of the light beams, and the steps of the shifts between respective sub-sets are substantially uniform. In the example depicted in FIG. 5 for recording color-component images of the objective multi-color image, the reference sub-set is C1 and the remaining sub-sets C2, C3 and C4 are obtained by shifting the reference sub-set is C1 by the step which is two or three.

After performing the aforementioned processing, the recording mode decision mean 14a transmits information (hereinafter referred to as "recording mode information") D3 indicating the selected recording mode and information (hereinafter referred to as "combinational information") D4 indicating the combinations of the used light beams to the swath change means 14b, the feed speed set means 14c and the recording start position set means 14d.

The swath change means 14b changes the divisional width of the image data D1 to be applicable to the recording width of the recording head 12. The swath change means 14b executes the following processing:

First, the swath change means 14b receives the image data D1 from the network 50 while receiving the recording mode information D3 and the combinational information D4 from the recording mode decision means 14a. The network 50 supplies the image data D1 to the swath change means 14b as a set of a large number of zonal image data (hereinafter referred to as "line data") d1, d2, d3, . . . fragmentated in correspondence to the recording width of a single light beam. Then, the swath change means 14b segments a number of line data d1, d2, d3, . . . every line data of a number corresponding to the recording width (i.e., the recording width or the swath of the overall plurality of used light beams in the subscanning direction) of the recording head 12. At this time, the swath change mean 14b can specify the recording width of the recording head 12 with reference to the received recording mode information D3 and the received combinational information D4. Further, the swath change means 14b successively allocates light beams for recording to the respective ones of the segmented line data.

FIG. 6 illustrates exemplary results of processing of the swath change means 14b allocating the light beams for recording the respective line data d1, d2, d3, . . . . When the received recording mode information D3 indicates the first recording mode, the swath change means 14b uses all 16 light beams B1 to B16. Therefore, the line data d1, d2, d3. . . are fragmentated every 16 data, so that the respective ones of the 16 light beams B1 to B16 are successively allocated as those for recording the line data d1, d2, d3, . . . . When the received recording mode information D3 indicates the second recording mode, on the other hand, the swath change means 14b specifies the combinations of the used light beams with reference to the combinational information D4. The examples of the second recording mode in FIG. 6 correspond to the examples of FIG. 5. When the combinational information D4 indicates the combination of the eight light beams B1 to B8, for example, the line data d1, d2, d3, . . . are fragmentated every 8 data so that the respective ones of the eight light beams B1 to B8 are successively allocated as those for recording the respective line data d1, d2, d3, . . . Also when the combinational information D4 indicates another combination of the light beams, light beams for recording the respective line data d1, d2, d3, . . . are allocated by similar processing.

After performing the aforementioned processing, the swath change means 14b transmits the driving signal D5 including a large number of line data d1, d2, d3, . . . and the allocation of the light beams B1 to B16 for recording the line data d1, d2, d3, . . . to the driver 15.

The feed speed set means 14c sets the feed speed of the recording head 12 in the subscanning direction to be applicable to the recording width of the recording head 12. The feed speed set means 14c executes the following processing:

First, the feed speed set means 14c receives the recording mode information D3 and the combinational information D4 from the recording mode decision means 14a. Then, the feed speed set means 14c sets the feed speed of the recording head 12 in response to the recording width (i.e., the recording width of the overall plurality of used light beams in the subscanning direction) of the recording head 12. At this time, the feed speed set means 14c can specify the recording width of the recording head 12 with reference to the received recording mode information D3 and the received combinational information D4.

When the received recording mode information D3 indicates the first recording mode, for example, the image recording apparatus 1 uses all 16 light beams B1 to B16. Therefore, the feed speed set means 14c sets the feed speed for feeding the recording head 12 by a distance corresponding to the recording width of the 16 light beams B1 to B16 during single rotation of the recording drum 11. When the received recording mode information D3 contrarily indicates the second recording mode, for example, the feed speed set means 14c further refers to the combinational information D4 for specifying the recording width of the used light beams. When the combinational information D4 indicates employment of eight light beams as shown in FIG. 5, the feed speed set means 14c sets the feed speed for feeding the recording head 12 by a distance corresponding to the recording width of the eight light beams during single rotation of the recording drum 11.

After performing the aforementioned processing, the feed speed set means 14c transmits information (hereinafter referred to as "feed speed information) D6 indicating the feed speed of the recording head 12 to the motor control means 14e.

The recording start position set means 14d sets a position of the recording head 12 in the subscanning direction for starting recording. The recording start position set means 14d performs the following processing:

First, the recording start position set means 14d receives the recording mode information D3 and the combinational information D4 from the recording mode decision means 14a. Then, the recording start position set means 14d sets a recording start position of the recording head 12. The recording start position set means 14d sets this recording start position for locating an endmost light beam (the rearmost light beam with respect to the feeding direction of the recording head 12) emitted from the recording head 12 on a position for starting recording the unit images on the recording surface of the recording material 10. The endmost light beam emitted from the recording head 12 varies with the combination of the used light beams. The recording start position set means 14d can specify the endmost light beam with reference to the received recording mode information D3 and the received combinational information D4.

When the received recording mode information D3 indicates the first recording mode or the received recording mode information D3 indicates the second recording mode while the combinational information D4 indicates the combination of the eight light beams B1 to B8, for example, the recording head 12 emits the light beam B1 as the endmost one. Therefore, the recording start position set means 14d sets the recording start position of the recording head 12 to locate the light beam B1 on the position for starting recording the unit images. When the received recording mode information D3 indicates the second recording mode while the received combinational information D4 indicates the combination of the eight light beams B4 to B11, for example, the recording head 12 emits the light beam B4 as the endmost one. Therefore, the recording start position set means 14d sets the recording start position of the recording head 12 to locate the light beam B4 on the position for starting recording the unit images.

In other words, the recording start position set means 14 shifts the recording start position of the recording head 12 by a distance responsive to the quantity of misregistration between combinations of light beams used for the respective unit images. The recording start position set means 14 finally starts recording the unit images from the same position on the recording surface.

After performing the aforementioned processing, the recording start position set means 14d transmits information (hereinafter referred to as "recording start position information") D7 indicating the recording start position of the recording head 12 to the motor control means 14e.

The motor control means 14e electrically controls operations of the subscanning motor 38 serving as the driving source for subscanning motion of the recording head 12. The motor control means 14e receives the feed speed information D6 and the recording start position information D7 from the feed speed set means 14c and the recording start position set means 14d respectively. The motor control means 14e controls the operations of the subscanning motor 38 on the basis of the information D6 and D7.

The motor control means 14f also electrically controls operations of the main scanning motor 26 serving as the driving source for rotary motion of the recording drum 11.

<2. Embodiment>

An example of reducing density fluctuation appearing on a resultant image in a case of preparing four printing plates including C, M, Y and K plates and superposing unit images related to the printing plates for preparing a resultant image with this image recording apparatus 1 is now described.

Figure 7:
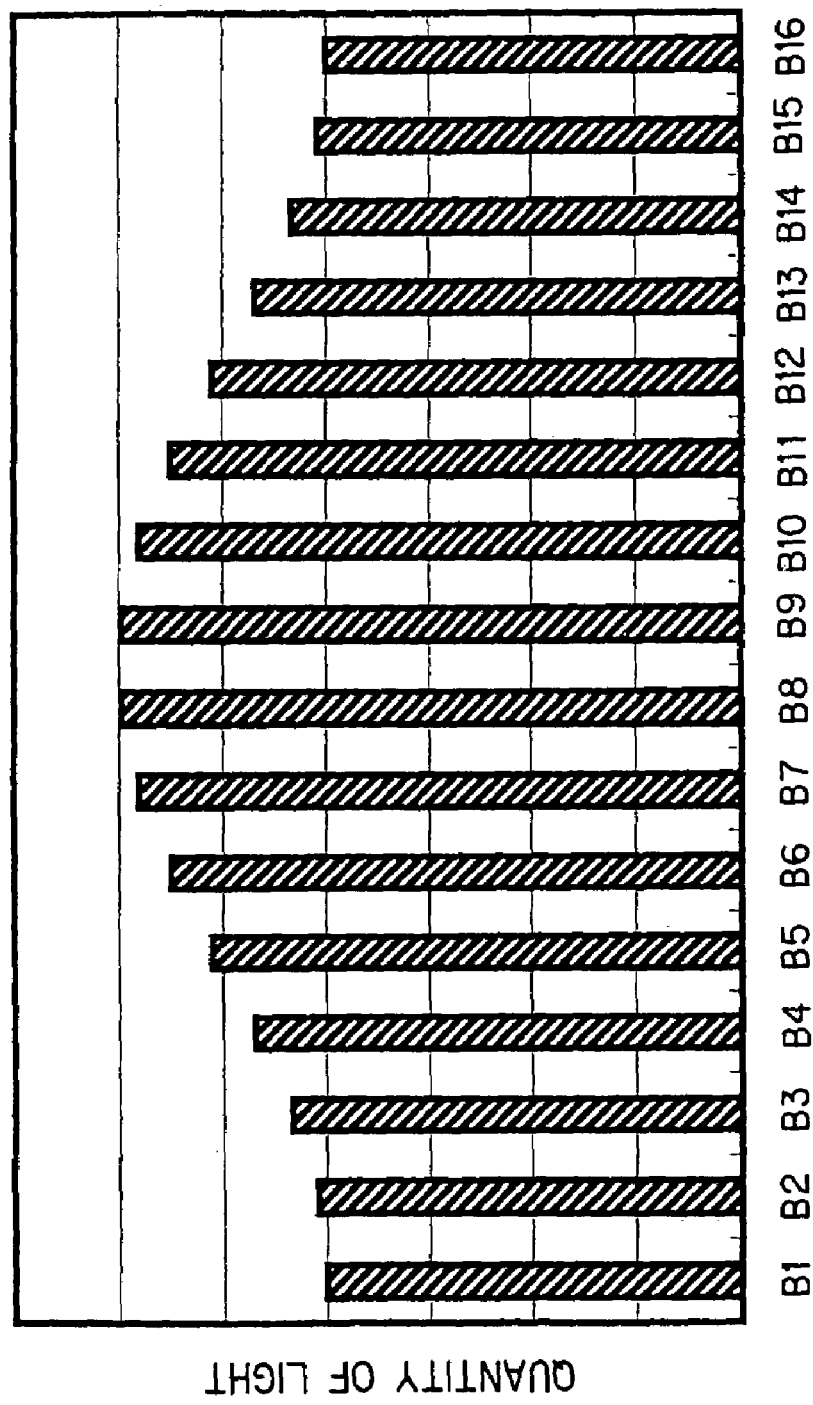
FIG. 7 illustrates an exemplary distribution of quantities of light of a plurality of light beams emitted from a recording head.
Figure 8A:
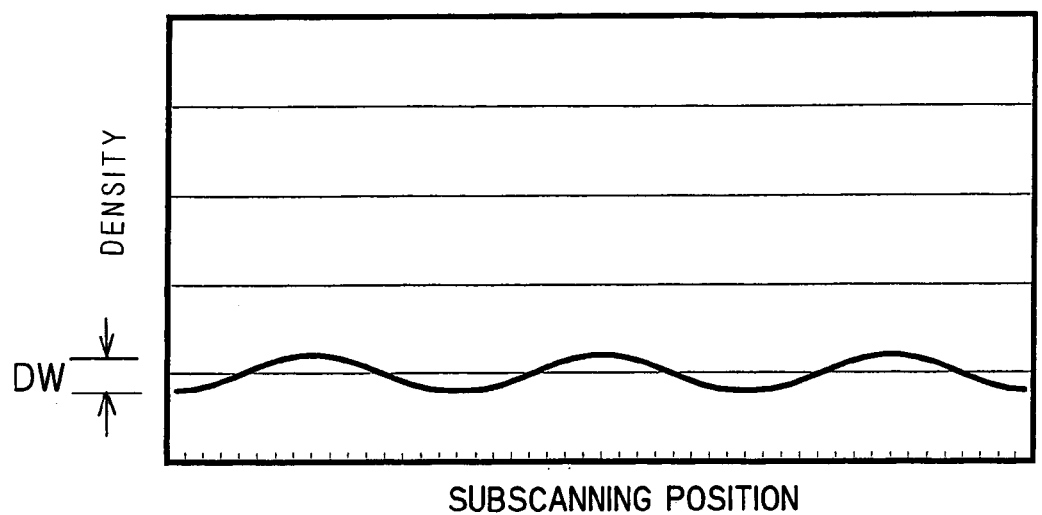
FIGS. 8A and 8B illustrate exemplary densities of unit images and a resultant image in a first recording mode of the image recording apparatus.
Figure 8B:
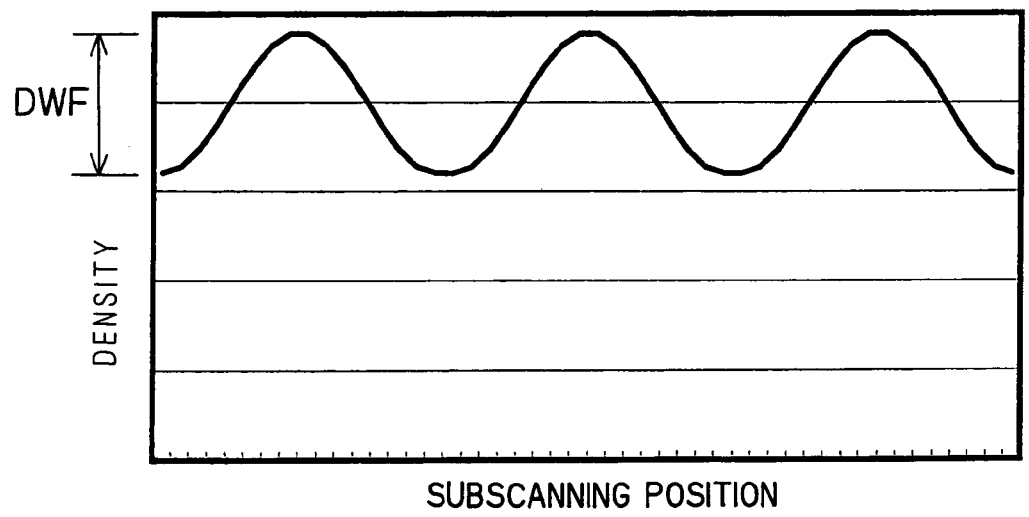

It is assumed that the quantities of light of the 16 light beams B1 to B16 emitted from the recording head 12 are sinusoidally distributed as shown in FIG. 7 in this embodiment. When using all 16 light beams B1 to B16 for recording the unit images similarly to the conventional image recording apparatus 100, periodic density fluctuation (density fluctuation width: DW) results in the unit images recorded on the recording material 10, as shown in FIG. 8A. Further, larger density fluctuation (density fluctuation width: DWF) appears in the resultant image formed by superposing these unit images with each other, as shown in FIG. 8B. Also in the image recording apparatus 1 according to the embodiment of the present invention, the unit images are recorded with all 16 light beams B1 to B16 and hence similar density fluctuation appears in the resultant image.

A case of recording unit images in the second recording mode of the image recording apparatus 1 is now described.

It is assumed that the recording mode decision means 14a selects combinations of used light beams on the basis of the correspondence shown in FIG. 5.

Figure 9:
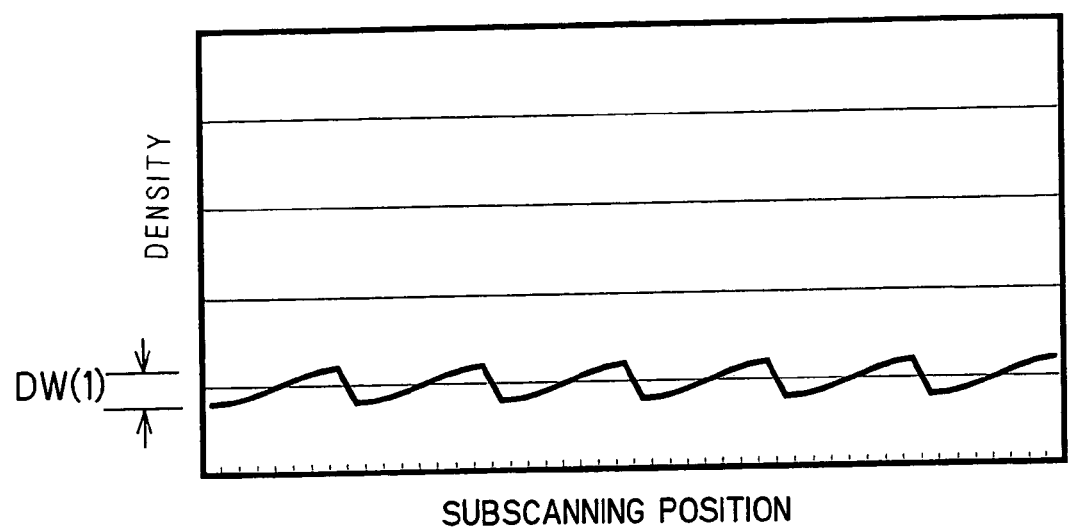

When preparing the C plate, the image recording apparatus 1 selects the eight adjacent light beams B1 to B8 on the basis of the correspondence shown in FIG. 5. The recording head 12 records unit images on the recording material 10 with the eight light beams B1 to B8. Therefore, periodic density fluctuation results in the unit images recorded on the recording material 10 on the basis of the distribution of quantities of light of the eight light beams B1 to B8, as shown in FIG. 9. It is assumed that DW(1) represents the current density fluctuation width. The current density fluctuation period is equal to the recording width of the eight light beams B1 to B8. In other words, the density fluctuation period is shorter than that in the case of using the first recording mode.

Figure 10:
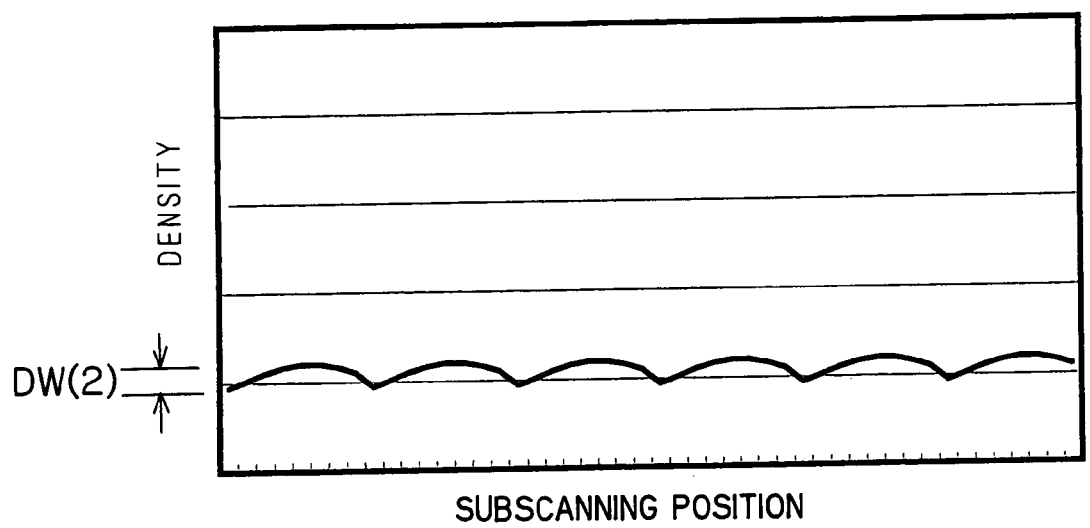

When preparing the M, Y and K plates, the image recording apparatus 1 similarly records unit images on the recording material 10 with the eight adjacent light beams B4 to B11, the eight adjacent light beams B6 to B13 and the eight adjacent beams B9 to B16 respectively. Therefore, periodic density fluctuations result in the unit images recorded on the recording material 10 on the basis of distributions of quantities of light of the eight light beams B4 to B11, the eight light beams B6 to B13 and the eight light beams B9 to B16 as shown in FIGS. 10, 11 an 12 respectively. It is assumed that DW(2), DW(3) and DW(4) represent the density fluctuation widths caused when preparing the M, Y and K plates respectively.

Thus, periodic density fluctuation results in the respective ones of the unit images recorded on the C, M, Y and K plates. However, the tendencies of the density distributions of the unit images, recorded with different distributions of the quantities of light, are different from each other. In the resultant image formed by superposing the unit images related to the C, M, Y and K plates with each other, therefore, the density fluctuation in the respective unit images is not amplified but canceled and reduced as shown in FIG. 13. In other words, the following relation necessarily holds between the density fluctuation width DWC in the resultant image shown in FIG. 13 and the density fluctuation widths DW(1), DW(2), DW(3) and DW(4) of the unit images in the individual plates:

$$DWC < DW(1) + DW(2) + DW(3) + DW(4)$$

According to this embodiment, the image recording apparatus 1 records four unit images with the same number of different combinations of light beams. Therefore, it follows that the image recording apparatus 1 necessarily uses different light beams for performing recording on the same positions between the four unit images (see FIG. 6). Therefore, the density fluctuation in the resultant image is more reliably reduced.

Further, the density fluctuation period in the resultant image according to the embodiment shown in FIG. 13 is shortened as compared with that in the conventional resultant image shown in FIG. 8B. This is because the image recording apparatus 1 records the respective ones of the four unit images with combinations of the same number of light beams. According to the human vision, it is harder to recognize the density fluctuation when the density fluctuation period is reduced in the resultant image. According to this embodiment, the image recording apparatus 1 reduces the density fluctuation period of the resultant image in the aforementioned manner, so that the density fluctuation is further inconspicuous.

Thus, the image recording apparatus 1 according to this embodiment records the respective ones of the plurality of unit images superposed with each other for forming the resultant image with different combinations of the plurality of light beams B1 to B16. Therefore, the image recording apparatus 1 can differentiate the tendencies of the density distributions resulting in the respective unit images from each other for reducing the periodic density fluctuation appearing in the resultant image formed by superposing the unit images with each other.

<3. Modifications>

While the principal embodiment of the present invention has been described, the present invention is not restricted to the aforementioned example.

For example, the recording mode decision means 14a may alternatively successively select a plurality of previously prepared combinations when selecting the combinations of the used light beams, regardless of the appendix data D2. Also in this case, the combinations of the used light beams vary with a plurality of continuously recorded unit images. Therefore, the image recording apparatus 1 can attain an effect of reducing the periodic density fluctuation in the resultant image similarly to the aforementioned embodiment. In this case, further, it is possible to attain a similar effect also under network environment incapable of properly receiving the appendix data D2.

Not the recording mode decision means 14a but the operator may alternatively directly decide the used recording mode and the combinations of the used light beams. For example, the operator manually inputs the used recording mode and the combinations of the used light beams from the input means 16 and transmits the same to the recording decision means 14a. The recording mode decision means 14a may transmit the received information to the swath change means 14b, the feed speed set means 14c and the recording start position set mean 14d as the recording mode information D3 and the combinational information D4.

Figure 14:
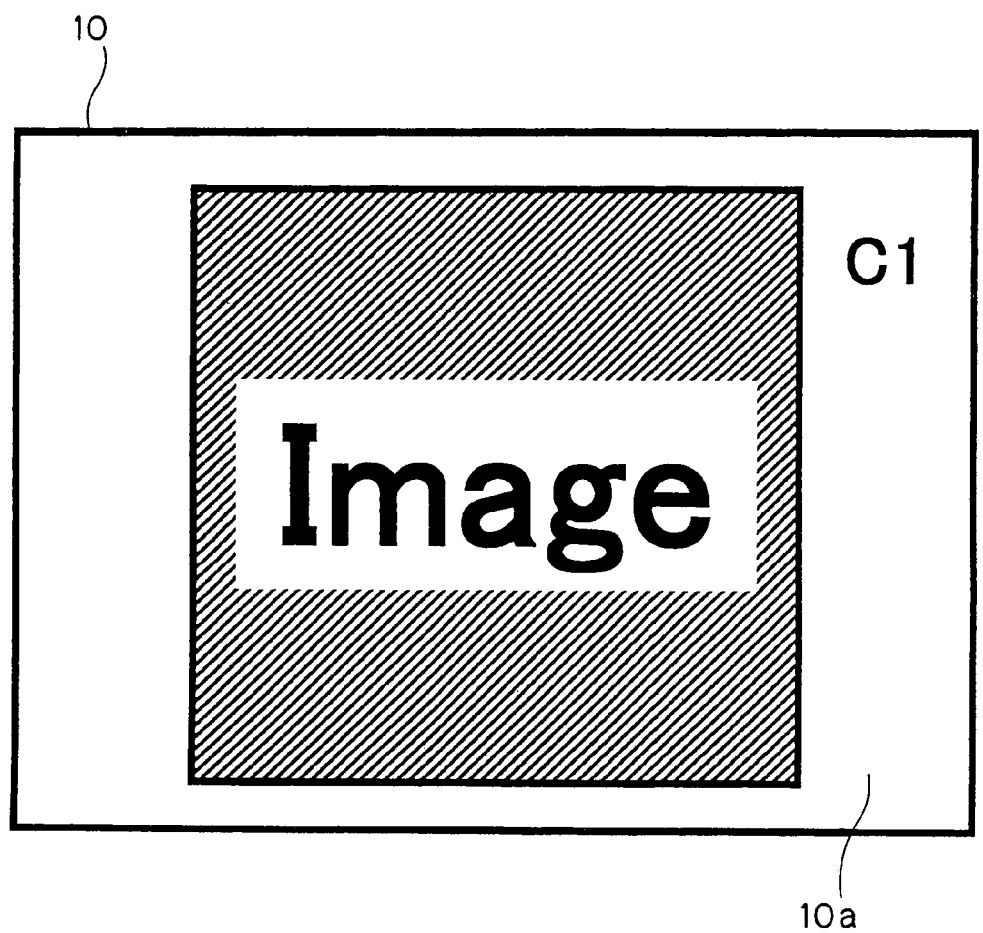
FIG. 14 illustrates an exemplary reference number related to a combination of light beams employed for recording on a marginal region of a recording surface of a recording material.
Figure 15:
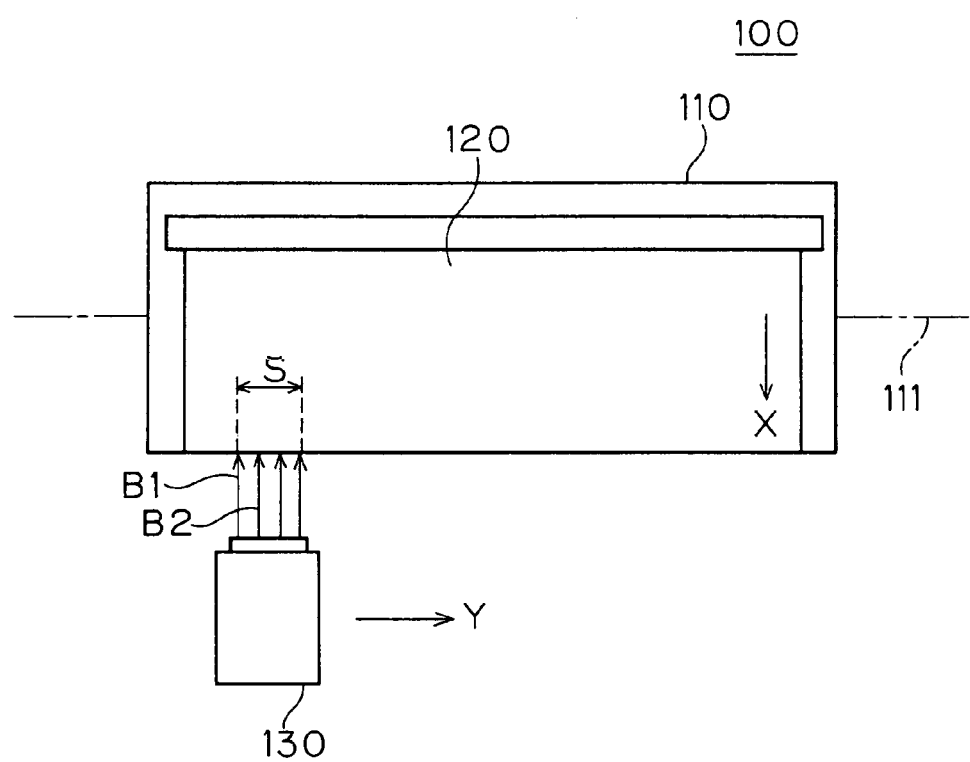
FIG. 15 illustrates a conventional image recording apparatus.

When the operator can manually input the combinations of the light beams, the image recording apparatus 1 may record the reference numbers C1 to C4 related to the combinations of the used light beams on a marginal region of the recording surface or imaging area of the recording material 10. The marginal region, which is a region having no entitative meaning as a recorded image, is generally located outside an entitative image. When the reference number C1 denotes the combination of used light beams as shown in FIG. 14, for example, the image recording apparatus 1 records the reference number C1 on a marginal region 10a of the recording surface of the recording material 10 on which the unit images are recorded. The recorded information is not restricted to such a reference number but may be formed by that capable of specifying the combination of the used light beams, as a matter of course. In this case, the operator can refer to the information recorded on a precedently used printing plate when the printing plate must be re-prepared, to recognize the combination of the light beams used for the precedent recording. When inputting the combination of the light beams based on this information, therefore, the operator can re-record the unit image with the light beams of the same combination as the precedent one. This mode is effective particularly when it is necessary to re-prepare part of a series of printing plates prepared by successively selecting a plurality of combinations of light beams regardless of the appendix data D2.

The image recording apparatus 1 may alternatively use both of the first and second recording modes as to a single unit image. This is useful when the AM and FM halftone dot systems are mixed into the single unit image, for example. For example, the image recording apparatus 1 may previously divide the image data D1 into regions according to the AM and FM halftone dot systems respectively for using the first and second recording modes for the AM and FM halftone dot systems respectively.

The image recording apparatus 1 can employ various other modes as to the combinations of the used light beams. According to the present invention, it is possible to attain an effect of reducing density fluctuation in a resultant image by recording at least two of a plurality of unit images with different combinations of light beams. Therefore, unit images recorded with the same combination of light beams may be present among the plurality of unit images. The light beams for recording the respective ones of the plurality of unit images may not be in the same number or are not restricted to combinations of continuously adjacent light beams. Further, light beams not used for any recording of the plurality of unit images may be present, or unit images recorded with all of the plurality of light beams may be present. The total number of the light beams emitted from the recording head 12 may not be 16, as a matter of course.

The plurality of light sources 12a may not be arranged in the recording head 12. For example, the light sources 12a may alternatively be arranged outside the recording head 12, so that the light beams B1 to B16 obtained from the light sources 12a are guided to the imaging optical system 12b of the recording head 12 through optical fiber members.

The plurality of light sources 12a themselves may not switch emission and stoppage of the light beams B1 to B16. For example, the plurality of light sources 12a may continuously emit the light beams B1 to B16, so that the image recording apparatus 1 modulates the light beams B1 to B16 for using the same. More specifically, light modulation means such as a diffraction light valve may be inserted between the plurality of light sources 12a and the imaging optical system 12b so that operations of the light modulation means are controlled with the driving signal D5. When using such light modulation means, the image recording apparatus 1 can remarkably increase the number of light beams emissive independently of each other. However, the problem of the density fluctuation in the resultant image is also easy to arise following this. Therefore, the present invention is effective.

When using such light modulation means, further, the image recording apparatus may divide the light beam emitted from a light source into a plurality of light beams with a splitter, for using the same. In this case, outgoing points of the respective light beams on the outgoing surface of the beam splitter can be regarded as the recording sources provided on the recording head 12. It is assumed that the recording sources according to the present invention also include those of this mode.

The recording head 12 may not simultaneously emit the plurality of light beams B1 to B16 from the serially arranged light sources. For example, the recording head 12 may alternatively emit a plurality of light beams from two-dimensionally arranged light sources toward parallel positions as a result by controlling the emission timing. In this case, the recording head 12 treats light sources emitting light beams adjacent on the recording material 10 as adjacent light sources regardless of actual positions of arrangement in the recording head 12.

The recording sources according to the present invention, which may be formed by light sources such as semiconductor lasers or LEDs, may alternatively be formed by ink-jet recording sources spraying droplets to the recording surface, for example. When employing the ink-jet recording sources, the image recording apparatus 1 can directly form lipophilic and hydrophilic regions on each printing plate, for example.

The image recording apparatus 1 may alternatively comprise a plurality of recording heads 12.

The present invention is not restricted to an image recording apparatus for preparing printing plates but is also applicable to any image recording apparatus recording the respective ones of a plurality of unit images superposed with each other for forming a resultant image. For example, the present invention is applicable to an image recording apparatus recording electrostatic latent images corresponding to unit images, or directly recording unit images on printing paper.

While the invention has been shown and described in detail, the foregoing description is in all aspects illustrative and not restrictive. It is therefore understood that numerous modifications and variations can be devised without departing from the scope of the invention.

What is claimed is:

1. An image recording apparatus for separately recording respective unit images which are to be superposed to form an objective image, said image recording apparatus comprising:
    a) a recording head comprising n recording sources which are independently controllable; and
    b) a controller for operating a partial-source recording mode,
    wherein said partial-source recording mode records a first unit image by using a first sub-set of a plurality of recording sources less than n among said n recording sources of said recording head, and
    said partial-source recording mode records a second unit image by using a second sub-set of a plurality of recording sources less than n among said n recording sources of said recording head, said second sub-set being different from said first sub-set and comprising at least one recording source included in said first sub-set.

2. The image recording apparatus according to claim 1, wherein said first and second sub-sets of recording sources comprise same numbers of adjacent recording sources.

3. The image recording apparatus according to claim 2, wherein
    said controller enables said recording head such that
    1) a unit image is recorded on a recording medium, and
    2) information indicating said first and second sub-sets of recording sources is recorded on a marginal region of said recording medium.

4. The image recording apparatus according to claim 3, wherein
    said controller is operable in a selected one of
    i) said partial-source recording mode, and
    ii) a full-source recording mode in which all of said n recording sources are used to record respective ones of said respective unit images.

5. An image recording apparatus for separately recording respective unit images which are to be superposed to form an objective image, said image recording apparatus comprising:
    a) a recording head comprising a plurality of recording sources which are independently controllable; and
    b) a controller for controlling said plurality of recording sources in a partial-source recording mode in which different sub-sets of recording sources, which are at least partially different from each other, are employed to record at least two unit images of said objective image, respectively,
    wherein all of said sub-sets of recording sources comprise same numbers of adjacent recording sources,
    said controller enables said recording head such that
    1) a unit image is recorded on a recording medium by a selected sub-set of recording sources, and
    2) information indicating said selected sub-set of recording sources is recorded on a marginal region of said recording medium,
    said controller is operable in a selected one of
    i) said partial-source recording mode, and
    ii) a full-source recording mode in which all of said plurality of recording source are used to record respective ones of said respective unit images, and
    said controller comprises
    a receiving element receiving appendix data indicating respective attributes of said at least two unit images, and
    a selecting element selecting one of said partial-source recording mode and said full-source recording mode in response to said appendix data.

6. The image recording apparatus according to claim 5, wherein said controller further comprises a selection element selecting said sub-sets of recording sources in response to said appendix data.

7. The image recording apparatus, according to claim 6, wherein
    said objective image is a multi-color image,
    said respective unit images are color-component images of said multi-color image, and
    said plurality of recording sources are light sources selectively emitting light beams onto an imaging medium to obtain respective ones of printing plates prepared for a printing process of said multi-color image.

8. A method of recording respective unit images which are to be superposed to form an objective image using a recording head comprising n recording sources which are independently controllable, said method comprising the steps of:
    selecting a first sub-set of recording sources less than n among said n recording sources;
    recording a first unit image of said objective image on a first imaging area with said first sub-set of recording sources;
    selecting a second sub-set of recording sources less than n among said plurality of recording sources, said second sub-set being different from said first sub-set and comprising at least one recording source included in said first sub-set; and
    recording a second unit image of said objective image on a second imaging area with said second sub-set of recording sources.

9. The method according to claim 8, wherein said first and second sub-sets of recording sources comprise same numbers of adjacent recording sources.

10. The method according to claim 9, further comprising the step of recording information indicating said first and second sub-sets of recording sources on respective marginal regions of said first and second imaging areas, respectively.

11. The method according to claim 10, further comprising the step of selecting one of a partial-source recording mode and a full-source recording mode,
    wherein said partial-source recording mode is a mode in which said first and second sub-sets of recording sources are used for recording said first and second unit images, respectively, and
    said full-source recording mode is a mode in which all of said n recording sources are used to record respective unit images.

12. A method of recording respective unit images which are to be superposed to form an objective image using a recording head comprising a plurality of recording sources which are independently controllable, said method comprising the steps of:
  (a) selecting a first sub-set of recording sources among said plurality of recording sources;
  (b) recording a first unit image of said objective image on a first imaging area with said first sub-set of recording sources;
  (c) selecting a second sub-set of recording sources which is at least partially different from said first sub-set of recording sources among said plurality of recording sources, wherein said first and second sub-sets of recording sources comprise same numbers of adjacent recording sources;
  (d) recording a second unit image of said objective image on a second imaging area with said second sub-set of recording sources;
  (e) recording information indicating said first and second sub-sets of recording sources on respective marginal regions of said first and second imaging areas, respectively;
  (f) selecting one of a partial-source recording mode and a full-source recording mode, wherein said partial-source recording mode is a mode in which said first and second sub-sets of recording sources are used for recording said first and second unit images, respectively, and said full-source recording mode is a mode in which all of said plurality of recording sources are used to record respective unit images;
  (g) receiving appendix data indicating attributes of said respective unit images; and
  (h) selecting one of said partial-source recording mode and said full-source recording mode in response to said appendix data.

13. The method according to claim 12, wherein selection of one of said first and second sub-sets of recording sources is conducted in response to said appendix data.

14. The method according to claim 13, wherein
said objective image is a multi-color image,
said respective unit images are color-component images of said multi-color image, and
said plurality of recording sources are light sources selectively emitting light beams onto an imaging medium to obtain respective ones of printing plates prepared for a printing process of said multi-color image.

15. An image recorder for separately recording a plurality of color component images of an objective multi-color image, said image recorder comprising:
  a recording head comprising an arrangement of n recording sources;
  a selector selecting a first sub-set of a plurality of recording sources less than n and a second sub-set of a plurality of recording sources less than n among said n recording sources depending on a color component, said second sub-set being different from said first sub-set and comprising at least one recording source included in said first sub-set; and
  a controller controlling said recording head to record a first color component image by using said first sub-set of recording sources and record a second color component image by using said second sub-set of recording sources.

16. The image recorder according to claim 15, wherein selections of parts of said recording sources depending on color components are partially overlapped among said plurality of color components.

17. The image recorder according to claim 15, wherein
said first sub-set of recording sources comprises adjacent recording sources in said arrangement of recording sources, and
said second sub-set of recording sources comprises adjacent recording sources in said arrangement of recording sources.

* * * * *